(12) United States Patent
Kulkarni et al.

(10) Patent No.: US 9,772,903 B2
(45) Date of Patent: Sep. 26, 2017

(54) RESILIENT REGISTER FILE CIRCUIT FOR DYNAMIC VARIATION TOLERANCE AND METHOD OF OPERATING THE SAME

(71) Applicant: INTEL CORPORATION, Santa Clara, CA (US)

(72) Inventors: Jaydeep P. Kulkarni, Portland, OR (US); Keith A. Bowman, Hillsboro, OR (US); James W. Tschanz, Portland, OR (US); Vivek K. De, Beaverton, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/083,122

(22) Filed: Mar. 28, 2016

(65) Prior Publication Data
US 2016/0210192 A1    Jul. 21, 2016

Related U.S. Application Data

(62) Division of application No. 13/976,859, filed as application No. PCT/US2011/067632 on Dec. 28, 2011, now Pat. No. 9,329,918.

(51) Int. Cl.
| | |
|---|---|
| *G06F 11/10* | (2006.01) |
| *G06F 11/00* | (2006.01) |
| *G11C 29/52* | (2006.01) |
| *G06F 9/30* | (2006.01) |
| *G06F 11/07* | (2006.01) |
| *G06F 9/38* | (2006.01) |
| *G11C 29/42* | (2006.01) |
| *G11C 7/18* | (2006.01) |

(52) U.S. Cl.
CPC ...... *G06F 11/1068* (2013.01); *G06F 9/30141* (2013.01); *G06F 9/3861* (2013.01); *G06F 11/0751* (2013.01); *G06F 11/1008* (2013.01); *G11C 29/52* (2013.01); *G11C 7/18* (2013.01); *G11C 29/42* (2013.01)

(58) Field of Classification Search
None
See application file for complete search history.

(56) References Cited

U.S. PATENT DOCUMENTS

| | | | |
|---|---|---|---|
| 6,282,139 B1 | 8/2001 | Clark et al. | |
| 6,701,484 B1 * | 3/2004 | Jordan | ............... G06F 11/1008 714/718 |

(Continued)

FOREIGN PATENT DOCUMENTS

KR    10-2009-0129624 A    12/2009

OTHER PUBLICATIONS

International Search Report and Written Opinion for PCT Application No. PCT/US2011/067632, dated Sep. 21, 2012, 10 pages.

(Continued)

*Primary Examiner* — Justin R Knapp
(74) *Attorney, Agent, or Firm* — Schwabe, Williamson & Wyatt, P.C.

(57) ABSTRACT

The disclosed system and method detect and correct register file read path errors that may occur as a result of reducing or eliminating supply voltage guardbands and/or frequency guardbands for a CPU, thereby increasing overall energy efficiency of the system.

17 Claims, 5 Drawing Sheets

(56) References Cited

U.S. PATENT DOCUMENTS

| | | | |
|---|---|---|---|
| 7,200,068 | B2 | 4/2007 | Khellah et al. |
| 7,221,605 | B2 | 5/2007 | Forbes |
| 7,562,273 | B2 | 7/2009 | Chu et al. |
| 7,570,080 | B2 | 8/2009 | Nintunze et al. |
| 7,739,524 | B2 * | 6/2010 | Mangione-Smith .. G06F 1/3203 713/300 |
| 8,111,579 | B2 | 2/2012 | De et al. |
| 8,125,820 | B2 | 2/2012 | Masuo et al. |
| 8,363,482 | B2 | 1/2013 | Kim et al. |
| 8,397,133 | B2 | 3/2013 | Clark et al. |
| 8,650,470 | B2 * | 2/2014 | Flautner .............. G06F 11/1604 714/799 |
| 2003/0007408 | A1 | 1/2003 | Lien et al. |
| 2003/0217325 | A1 | 11/2003 | Tremblay et al. |
| 2005/0246613 | A1 | 11/2005 | Blaauw et al. |
| 2006/0280019 | A1 * | 12/2006 | Burton .................. G06F 1/3203 365/226 |
| 2007/0300131 | A1 * | 12/2007 | Chu ....................... G11C 29/32 714/768 |
| 2009/0144583 | A1 | 6/2009 | Bruennert et al. |
| 2009/0292977 | A1 | 11/2009 | Bradley et al. |
| 2011/0093763 | A1 * | 4/2011 | Salters ................ G06F 13/1636 714/758 |
| 2011/0167296 | A1 | 7/2011 | Fox et al. |

OTHER PUBLICATIONS

International Preliminary Report on Patentability for PCT Application No. PCT/US2011/067632, dated Jul. 10, 2014, 3 pages.
Office Action mailed Feb. 9, 2015 for TW Patent Application No. 101144142, 3 pages.
Notice of Allowance issued Jan. 11, 2016 for U.S. Appl. No. 13/976,859, 20 pages.
Supplementary European Search Report issued Feb. 29, 2016 for EP Application No. 11879150.8, 7 pages.
Extended European Search Report issued Sep. 2, 2016 for EP Application No. 11879150.8, 13 pages.

* cited by examiner

RESILIENT REGISTER FILE CIRCUIT FOR DYNAMIC VARIATION TOLERANCE AND METHOD OF OPERATING THE SAME

CROSS REFERENCE TO RELATED APPLICATIONS

The present application is a divisional of U.S. application Ser. No. 13/976,859, filed Jun. 27, 2013, entitled "RESILIENT REGISTER FILE CIRCUIT FOR DYNAMIC VARIATION TOLERANCE AND METHOD OF OPERATING THE SAME" which is a national phase entry under 35 U.S.C. §371 of International Application No. PCT/US2011/067632, filed Dec. 28, 2011, entitled "RESILIENT REGISTER FILE CIRCUIT FOR DYNAMIC VARIATION TOLERANCE AND METHOD OF OPERATING THE SAME", which designated, among the various States, the United States of America. The Specification of the PCT/US2011/067632 and U.S. patent application Ser. No. 13/976,859 Applications are hereby incorporated by reference.

GOVERNMENT INTEREST

This invention was made with Government support under contract number HR0011-10-3-0007 awarded by the Department of Defense. The Government has certain rights in this invention.

TECHNICAL FIELD

This disclosure is generally related to memory cells, and in particular but not exclusively relates to circuitry for register files to enable error detection and correction.

BACKGROUND INFORMATION

A register file (RF) is an array of registers, e.g., memory cells, in a central processing unit (CPU). The register file can be positioned between an instruction-generation portion of the CPU and an instruction-execution portion of the CPU to temporarily store operands, e.g., instructions and memory locations. Because of the role of the register file, an erroneous transfer of data from the register file can result in the CPU executing incorrect instructions or can result in the CPU writing data to unintended memory locations.

The registers in the CPU are typically random access memory (RAM) cells. Register files are generally used as low level caches, due to fast read and write operates as compared to last level caches. The registers include write ports and read ports through which data may be written to and read from individual registers, respectively.

Conventional techniques are provided that attempt to reduce erroneous operation of register files and related circuitry. For example, to ensure that various transistors in the related circuitry operate correctly and transfer signals adequately, manufacturers provide a guardband for CPU supply voltages, e.g., Vdd or Vcc, on a chip. However, guardband use in supply voltages decreases the energy efficiency.

BRIEF DESCRIPTION OF THE SEVERAL VIEWS OF THE DRAWINGS

Non-limiting and non-exhaustive embodiments are described with reference to the following figures, wherein like reference numerals refer to like parts throughout the various views unless otherwise specified.

DETAILED DESCRIPTION

Figure 1:
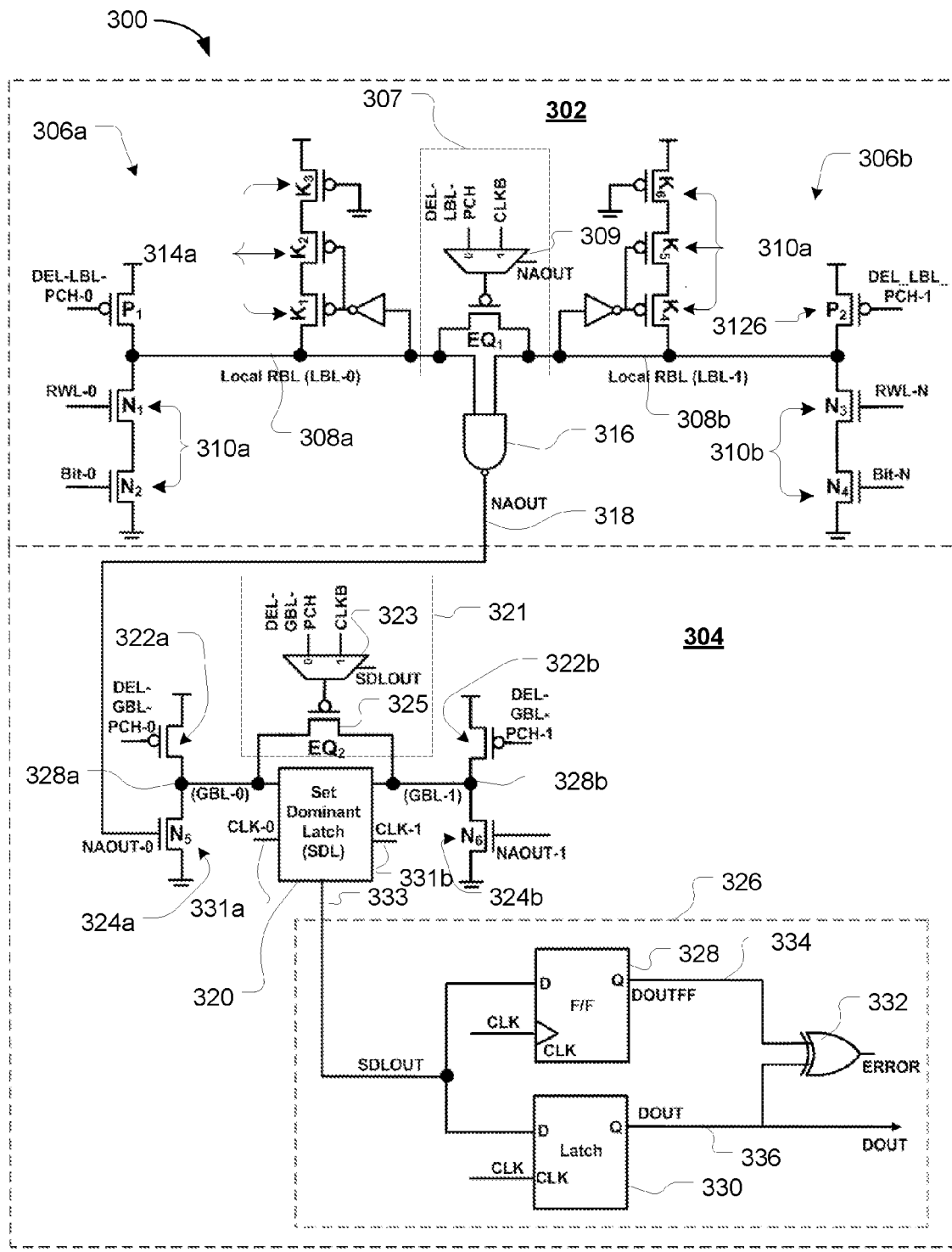
FIG. 1 illustrates a register file read path subsystem, according to one embodiment.

Embodiments of a register file read path and related circuitry and methods are described herein. In the following description, numerous specific details are given to provide a thorough understanding of embodiments. The embodiments can be practiced without one or more of the specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Disclosed herein is one or more embodiments of a resilient register file system which enables detection and correction of register file read path errors that may arise as a result of lowering guardbands on central processing unit (CPU) supply voltages. Several factors, such as Vcc droops, temperature changes, and transistor aging, have led CPU manufacturers to increase supply voltage levels by 10-15% above the minimum operating supply voltage (Vmin), so as to provide a guardband against dynamic variations in supply voltages. Often, the guardband ensures proper operation of the register file memory arrays against rarely occurring errors and is therefore a substantial contributing factor to processor energy inefficiency. The minimum operating supply voltage Vmin determines the processor energy efficiency because leakage currents through transistors are proportional to voltage across current conducting terminals of the transistors. Accordingly, operating the CPU at a 10-15% lower operating voltage could correspond to an operating power reduction of 20-30%.

According to one embodiment, the disclosed system converts sensing failures within the register file read path into sampling failures so that the failures are monitor-able from the register file read path. The sensing failures are converted to sampling failures by delaying the precharge of a local bitline during a local bitline evaluation time. By being able to monitor for the errors and then react to or correct the errors, one embodiment is able to eliminate or otherwise reduce the size of the guardband(s).

According to another embodiment, the disclosed system includes an error detection sequence useful for providing notification of detected errors in the register file read path. The notification of the detected errors is subsequently used to facilitate corrective action, such as flushing the instruction pipeline, refetching the value stored in a bitcell, raising the supply voltage, lowering the operation frequency, and/or other action.

According to yet another embodiment, a performance monitoring sequence monitors the ability of the register file read path to operate at faster frequencies and lower operating voltages. The performance monitoring sequence provides information that is indicative of the performance of the register file read path.

One embodiment provides an apparatus that includes: at least one bit line, and a register file circuit configured to operate with a decreased voltage guardband that compensates for an error in a signal provided in the at least one bit line during an access operation, the register file circuit being configured to operate with the decreased voltage guardband by detecting the error if the error occurs in response to the access operation and by repeating the access operation if the error is detected.

According to one embodiment of the apparatus, the voltage guardband is decreased to be between 0 and 5 percent of a minimum operating voltage associated with the register file circuit.

According to one embodiment of the apparatus, the voltage guardband is decreased to be between 0 and 1 volt.

According to one embodiment of the apparatus, the voltage guardband is decreased to be 0 volts.

According to one embodiment of the apparatus, the register file circuit includes: an edge-triggered clock-responsive device, and a level-triggered clock-responsive device, the register file circuit being configured to detect the error if an output of the edge-triggered clock-responsive device differs from an output of the level-triggered clock-responsive device.

One embodiment provides a register file circuit that includes: a local bitline stage including a plurality of bitcells, each of the plurality of bitcells having at least one bitline configured to provide a voltage level, and a global bitline stage communicatively coupled to the local bitline stage, the global bitline stage that includes: a sampling error detection circuit coupled to the plurality of bitcells and configured to detect a signal that is representative of the voltage level and configured to generate a notification indicative of an erroneous sample of the signal.

According to one embodiment of the register file circuit, the global bitline stage includes: a signal converter electrically coupled between the local bitline stage and the sampling error detection circuit and configured to convert the voltage level to the signal.

According to one embodiment of the register file circuit, the sampling error detection circuit includes a post-error sampling error detection circuit configured to provide the notification after the erroneous sample of the signal.

According to one embodiment of the register file circuit, the sampling error detection circuit includes: an edge-triggered clock-responsive device, a level-triggered clock-responsive device, and a signal differentiation circuit coupled to receive an edge-triggered output from the edge-triggered clock-responsive device and a level-triggered output from the level-triggered clock-responsive device and configured to generate the notification if the edge-triggered output is different from the level-triggered output.

According to one embodiment of the register file circuit, the sampling error detection circuit includes a pre-error sampling error detection circuit configured to generate the notification of the erroneous sample of the signal before the erroneous sample is detected.

According to one embodiment of the register file circuit, the sampling error detection circuit is configured to generate a plurality of notifications indicative of a respective plurality of erroneous samples of the signal before the erroneous samples are detected.

According to one embodiment of the register file circuit, each of the plurality of notifications corresponds to a respective plurality of time margins available to elapse before the signal is erroneously sampled.

According to one embodiment of the register file circuit, each of the plurality of time margins has a duration that is different from each other time margin of the plurality of time margins.

One embodiment provides a system that includes: a processor core configured to execute instructions, an instruction cache communicatively coupled to the processor core and configured to receive the digital instructions before or after the processor core executes the instructions, a data cache communicatively coupled to the processor core and configured to receive data from the processor core, and a register file circuit communicatively coupled to the processor core and that includes: a local bitline stage including a plurality of bitcells, each of the plurality of bitcells having at least one bitline configured to store a voltage level, and a global bitline stage communicatively coupled to the local bitline stage and having: a sampling error detection circuit coupled to the plurality of bitcells, the sampling error detection circuit configured to detect a signal that is representative of the voltage level and configured to generate a notification indicative of an erroneous sample of the signal.

According to one embodiment of the system, the sampling error detection circuit includes at least one edge-triggered clock-responsive device and at least one level-triggered clock-responsive device.

According to one embodiment of the system, the sampling error detection circuit is configured to generate the notification based on an output of the edge-triggered clock-responsive device and based on an output of the level-triggered clock-responsive device.

According to one embodiment of the system, the sampling error detection circuit includes a first edge-triggered clock-responsive device and at least one signal delay device coupled to an input of a second edge-triggered clock-responsive device, wherein the notification is based on outputs from both the first edge-triggered device and the second edge-triggered device.

One embodiment provides a method that includes: reducing, in a bitcell, a guardband voltage of a supply voltage that is used to reduce errors during bitcell evaluation in a register file circuit, while the guardband voltage is reduced, detecting an error in an evaluation path of the bitcell, and while the guardband voltage is reduced, correcting the error detected in the evaluation path and repeating evaluation of the bitcell.

According to one embodiment of the method, the correcting the error includes increasing the supply voltage guardband voltage.

According to one embodiment of the method, correcting the error includes decreasing an operating frequency of the register file circuit.

According to one embodiment of the method, the guardband voltage includes reducing the guardband voltage to between 0% and 8% of the supply voltage.

According to one embodiment of the method, the detecting the error includes delaying a recharge of a voltage in the bitcell.

Figure 2:
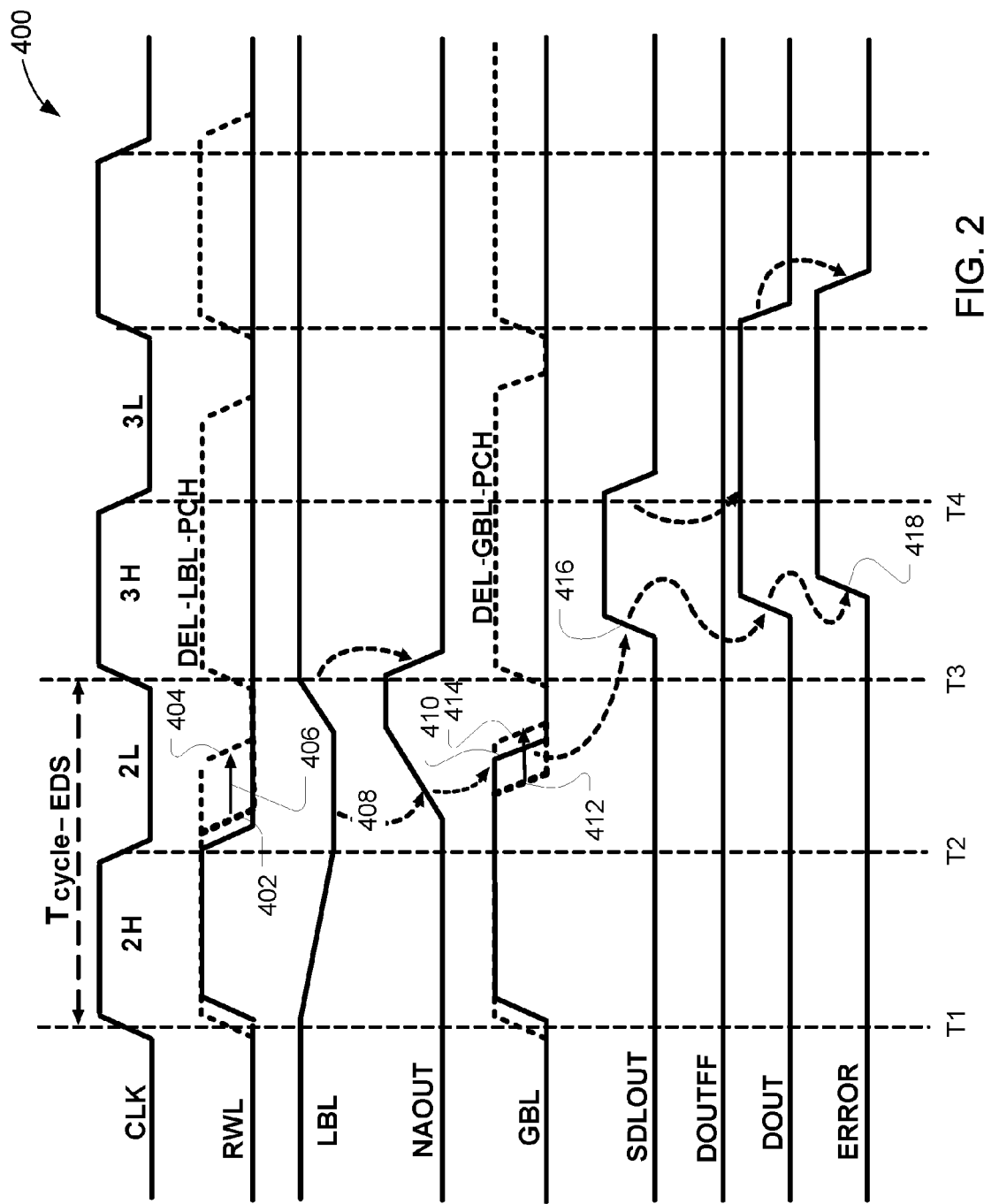
FIG. 2 illustrates a signal timing diagram of an example operation of the read path subsystem of FIG. 1, according to one embodiment.

FIG. 1 illustrates a register file read path subsystem 300, according to one embodiment. FIG. 2 illustrates a signal timing diagram 400 in accordance with operation of an embodiment of the read path subsystem 300. Periodic reference will be made hereinafter to the signal timing diagram 400 of FIG. 2 during the description of the read path subsystem 300.

The read path subsystem 300, or register file circuit, includes a local bitline (LBL) stage 302 and a global bitline (GBL) stage 304. The read path subsystem 300 of one embodiment is configured to convert a sensing failure to a sampling failure that is detectable by error detection circuitry discussed below.

The local bitline stage 302 includes bitcells 306a, 306b (collectively 306), a local bitline charge equalizer 307, and a bitline voltage sense circuit 316. Each bitcell 306a includes a local bitline 308a, one or more discharge transistors 310a, a precharge transistor 312a, and one or more local bitline keeper transistors 314a. While, only two bitcells 306 are shown, it is within the scope of the disclosure to have more or less bitcells 306 within the local bitline stage 302. Additionally, while a single bitcell 306a may be referenced herein, the disclosure may apply to cells that are not specifically referenced.

Each bitcell 306a includes the local bitline 308a that may be selectively discharged with discharge transistors 310a. According to one embodiment, the discharge transistors 310a may include N-type metal oxide semiconductor field effect transistors (MOSFETs) that selectively couple the bitline 308a to a ground reference. The discharge transistors 310a may selectively couple the bitline 308a to the ground reference in response to one or more signals, such as a read wordline (RWL) signal and/or a bitnode selection (Bit) signal.

The signal timing diagram 400 of FIG. 2 illustrates an example discharge of the local bitline 308a in response to the read wordline (RWL) signal, according to one embodiment. In particular, during clock cycle 2H the read wordline signal transitions from LOW to HIGH, thereby turning on one or more discharge transistors 310a and discharging the local bitline (LBL).

Referring back to FIG. 1, the local bitline 308a may be selectively charged with the precharge transistor 312a. The precharge transistor 312a selectively couples the local bitline 308a to a voltage reference, e.g., Vcc, in response to a delayed local bitline precharge signal (DEL-LBL-PCH). The delayed local bitline precharge signal may be configured to precharge the local bitline 308a and may additionally be configured to selectively delay precharging the local bitline 308a. According to one embodiment, the delayed local bitline precharge signal delays precharging the local bitline 308a if a dynamic variation, such as a voltage droop, affects the supply voltage, such as Vcc.

The signal timing diagram 400 of FIG. 2 illustrates an example of charging the local bitline 308a in response to the delayed local bitline precharge (DEL-LBL-PCH) signal. In particular, during clock cycle 2L the delayed local bitline precharge signal transitions from HIGH to LOW, thereby turning on precharge transistor 312a and charging the local bitline (LBL) 308a. A time shift of the falling edge of the delayed local bitline precharge signal is illustrated in timing cycle 2L and will be addressed in more detail below.

The one or more local bitline keeper transistors 314a are configured to selectively pull the voltage level of the local bitline 308a up to the level of the supply voltage. The keeper transistors 314a improve the noise immunity of dynamic nodes, such as the local bitline 308a. The one or more local bitline keeper transistors 314a may include P-type MOSFETs, according to one embodiment.

The local bitline charge equalizer 307 is configured to selectively equalize the charge across at least two bitlines 308 included in the local bitline stage 302. The local bitline charge equalizer 307 includes a signal selector 309 and a charge equalizer switch 311.

The signal selector 309 includes a control terminal, first and second input terminals, and the output terminal. According to one embodiment, the signal selector 309 may be a 2-input multiplexer. The control terminal is communicatively coupled to the bitline voltage sense circuitry 316 to receive a control signal NAOUT from an output terminal 318 of the bitline voltage sense circuitry 316. The first and second input terminals of the signal selector 309 are coupled to receive the delayed local bitline precharge signal (DEL-LBL-PCH) and the clock CLK signal, respectively. The signal selector 309 electrically couples the first input terminal to the output terminal while the control signal NAOUT is LOW and electrically couples the second input terminal to the output terminal while the control signal NAOUT is HIGH.

The charge equalizer switch 311 is configured to be controlled by the signal selector 309. The charge equalizer switch 311 includes a control terminal and two current conduction terminals. According to one embodiment, the charge equalizer switch 311 may include a P-type MOSFET transistor. The control terminal of the charge equalizer switch 311 is coupled to receive the output of the signal selector 309. The two current conduction terminals of the charge equalizer switch 311 are coupled to local bitlines 308a, 308b, and the charge equalizer switch 311 selectively creates a low resistance path between the bitlines 308.

In operation, according to one embodiment, the local bitline charge equalizer 307 maintains a low resistance connection between the local bitlines 308 while all local bitlines 308 are charged, or are charging. For example, if the control signal NAOUT is LOW and the delayed local bitline precharge signal (DEL-LBL-PCH) is LOW, then the local bitline charge equalizer 307 maintains a low resistance connection between the local bitlines 308. If, however, the control signal NAOUT is HIGH then the electrical coupling of the local bitlines 308 will depend on the clock CLK. According to one embodiment, the clock CLK is selectively transitioned from HIGH to LOW by the core of the CPU to decrease the charging time of one or more of the local bitlines 308 that has been discharged and read out.

The bitline voltage sense circuitry 316 is configured to sense the voltage level of the local bitlines 308. The bitline voltage sense circuitry 316 includes one or more input terminals coupled to respective local bitlines 308 and includes the output terminal 318 from which the control signal NAOUT is provided. The bitline voltage sense circuitry 316 is configured to determine if one or more local bitlines 308 discharges below a threshold voltage. The bitline voltage sense circuitry 316 transitions the control signal NAOUT from LOW to HIGH at the output terminal 318, in response to one or more local bitlines 308 discharges below the threshold voltage. According to one embodiment, the bitline voltage sense circuitry 316 is a NAND gate and the threshold voltage is a threshold voltage of a P-type MOSFET within the NAND gate.

The global bitline (GBL) stage 304 receives the control signal NAOUT from the local bitline stage 302 and provides notification of data sampling errors. The global bitline stage 304 includes a set dominant latch (SDL) 320, a global bitline charge equalizer 321, global bitline precharge transistors 322a, 322b, global bitline discharge transistors 324a, 324b, and an error detection sequence 326.

The set dominant latch 320 is responsive to global bitlines 328a, 328b (collectively 328) and clock signals 331a, 331b. If one or more of the global bitlines 328 are discharged, the set dominant latch 320 transitions an output signal SDLOUT from a first voltage level to a second voltage level on an output terminal 333. According to one embodiment, the first voltage level is LOW and the second voltage level is HIGH. According to another embodiment, the set dominant latch 320 resets the output signal SDLOUT to LOW on a subsequent rising or falling edge of at least one of the clock signals 331.

The global bitlines 328 are discharged by the global bitline discharge transistors 324 and are charged by the global bitline precharge transistors 322. The global bitline discharge transistors 324 selectively couple the global bitlines 328 to ground in response to the control signal NAOUT that is received from the local bitline stage 302. The global bitline precharge transistors 322 charge the global bitlines 328 in response to a delayed global bitline precharge signal (DEL-GBL-PCH). Selectively charging and discharging the global bitlines 328 in response to the control signal NAOUT propagates LOW and HIGH voltage levels, e.g., data, stored on local bitlines 308 to the set dominant latch 320.

The global bitline charge equalizer 321 selectively equalizes the global bitlines 328. The global bitline charge equalizer 321 includes a signal selector 323 and a charge equalizer switch 325. The global bitline charge equalizer 321 operates in a manner similar to the local bitline charge equalizer 307. Accordingly, further explanation of the global bitline charge equalizer 321 will not be provided herein.

The error detection sequence 326 receives the output signal SDLOUT from the set dominant latch 320 and uses clock-responsive devices to generate notification of sampling errors, according to one embodiment. The error detection sequence 326 includes a first clock-responsive device 328, a second clock-responsive device 330, and a signal differentiator 332.

The first clock-responsive device 328 and the second clock-responsive device 330 are communicatively coupled to the output terminal 333 of the set dominant latch 320 to receive the output signal SDLOUT. The first clock-responsive device 328 and the second clock-responsive device 330 also receive a clock input signal CLK. The first clock-responsive device 328 transfers the output signal SDLOUT to a first clock-responsive device output terminal 334 on each rising clock edge of the clock input signal CLK, as a first clock-responsive device output signal DOUTFF. The second clock-responsive device 330 transfers the output signal SDLOUT to a second clock-responsive device output terminal 336 while the input signal CLK is HIGH, as a second clock-responsive device output signal DOUT. According to one embodiment, the first clock-responsive device may be a positive edge-triggered D flip-flop, and the second clock-responsive device may be a positive level-triggered D latch.

The signal differentiator 332 is configured to provide a notification of differences between the output signals DOUTFF and DOUT. Inputs of the signal differentiator 332 are communicatively coupled to the first clock-responsive device output terminal 334 and the second clock-responsive device output terminal 336. The signal differentiator 332 outputs an error signal ERROR while the output signals DOUTFF and DOUT are different voltage levels. According to one embodiment, the signal differentiator 332 transitions the error signal ERROR from LOW to HIGH to indicate that a sampling error has occurred. According to another embodiment, the signal differentiator 332 is an XOR gate. In sum, the signal differentiator 332 provides notification that one clock-responsive device has captured or sampled data differently than the other clock-responsive device.

The signal timing diagram 400 of FIG. 2 will be used to describe how a sensing error is converted to a sampling error and various other features, according to one embodiment.

As a result of reducing or removing the guardband from the minimum operating supply voltage Vmin, dynamic variations to the operating supply voltage may cause the read wordline signal (RWL) and/or the bitline selection signal (Bit) to have a limited capacity for discharging the local bitline 308a. Due to process variations, the small geometry bitcell transistors, such as discharge transistors 310a and precharge transistors 312, experience significant threshold voltage (Vt) variation. At reduced supply voltages, such as if the guardband voltage is reduced to 0%-5% of the minimum supply voltage, the sensitivity of circuit parameters, such as read path delay, to the threshold voltage variation increases. Such sensitivity may limit successful register file read operation at low voltages. According to one embodiment, the guardband voltage is reduced to 0-1 V.

Within the signal timing diagram 400, a first period Tcycle—EDS illustrates an example of a sense error. The voltage level of the local bitline 308a is discharged during clock cycle 2H in response to a HIGH read wordline signal (RWL). However, the output signal NAOUT of the bitline sense circuit 316 has failed to sense, detect, or respond to voltage level change of the local bitline 308a. At the end of clock cycle 2H, the read wordline signal (RWL) transitions from HIGH to LOW, turning off the one or more discharge transistors 310a.

Shortly after time T2 in clock cycle 2L, the delayed local bitline precharge (DEL-LBL-PCH) signal normally electrically couples the local bitline 308a to the supply voltage at transition 402. However, by delaying the delayed local bitline precharge signal until transition 404 in the clock cycle 2L, as indicated by arrow 406, the bitline sense circuit 316 receives more time to sense, detect, or respond to the voltage level of the local bitline 308a. As a result, the bitline sense circuit 316 senses, detects, or responds to the voltage level change on the local bitline 308a later in the clock cycle 2L, indicated by transition 408, rather than missing the change entirely. According to one embodiment, the dynamic variation in the operating supply voltage causes the voltage level of the local bitline 308a to operate the bitline sense circuit 316 in a MOSFET weak inversion or subthreshold mode. According to another embodiment, the core of the CPU selectively delays the delayed local bitline precharge signal (DEL-LBL-PCH) if or while the core detects a dynamic variation in the operating supply voltage to increase the likelihood of sensing level changes to the local bitline signal.

The delayed transition 408 of the output signal NAOUT propagates through the global bitline stage 304 to produce notification of a sampling error. The transition 408 of the output signal NAOUT causes transition 410 of the voltage level of the global bitline (GBL) 328a. The delayed global bitline precharge signal (DEL-GBL-PCH) is delayed from transition 412 to transition 414 by, for example, the core of the CPU so that both the discharge transistor 324a and the global bitline precharge transistor 322a are not simultaneously turned on. Transition 416 of the output signal SDLOUT occurs in clock cycle 3H after time T3 rather than during clock cycle 2L, as would occur during a non-error transition. As a result, the positive edge-triggered first clock-responsive device 328 transfers a LOW signal to the first clock-responsive output signal DOUTFF, and the level-triggered second clock-responsive device 328 transfers a HIGH signal to the second clock-responsive output signal DOUT.

The signal differentiator 332 receives the LOW output signal DOUTFF, receives the HIGH output signal DOUT, and generates a notification of a sampling error at transition 418. The notification of the sampling error at transition 418 indicates that the first clock-responsive device 328 has generated an output that is dissimilar to the second clock-responsive device 330. Consequently, the register file read path subsystem 300 has converted a sense error into a sampling error.

Converting a sense error into a sampling error, in addition to providing sampling error notification, enables other portions of the CPU to initiate corrective action. For example, in response to receiving notification of a sampling error in the register file read path subsystem 300, the core of the CPU of one embodiment may repeatedly re-fetch the same instruction until the re-fetched instruction is read without a sampling error. In another embodiment, the core may reissue the same instruction until the sampling error ceases, may reduce the operating frequency, may raise the supply voltage, and/or may take some other action(s) in an effort to eliminate the error. Accordingly, the register file read path subsystem 300 enables read path error detection and correction.

Figure 3:
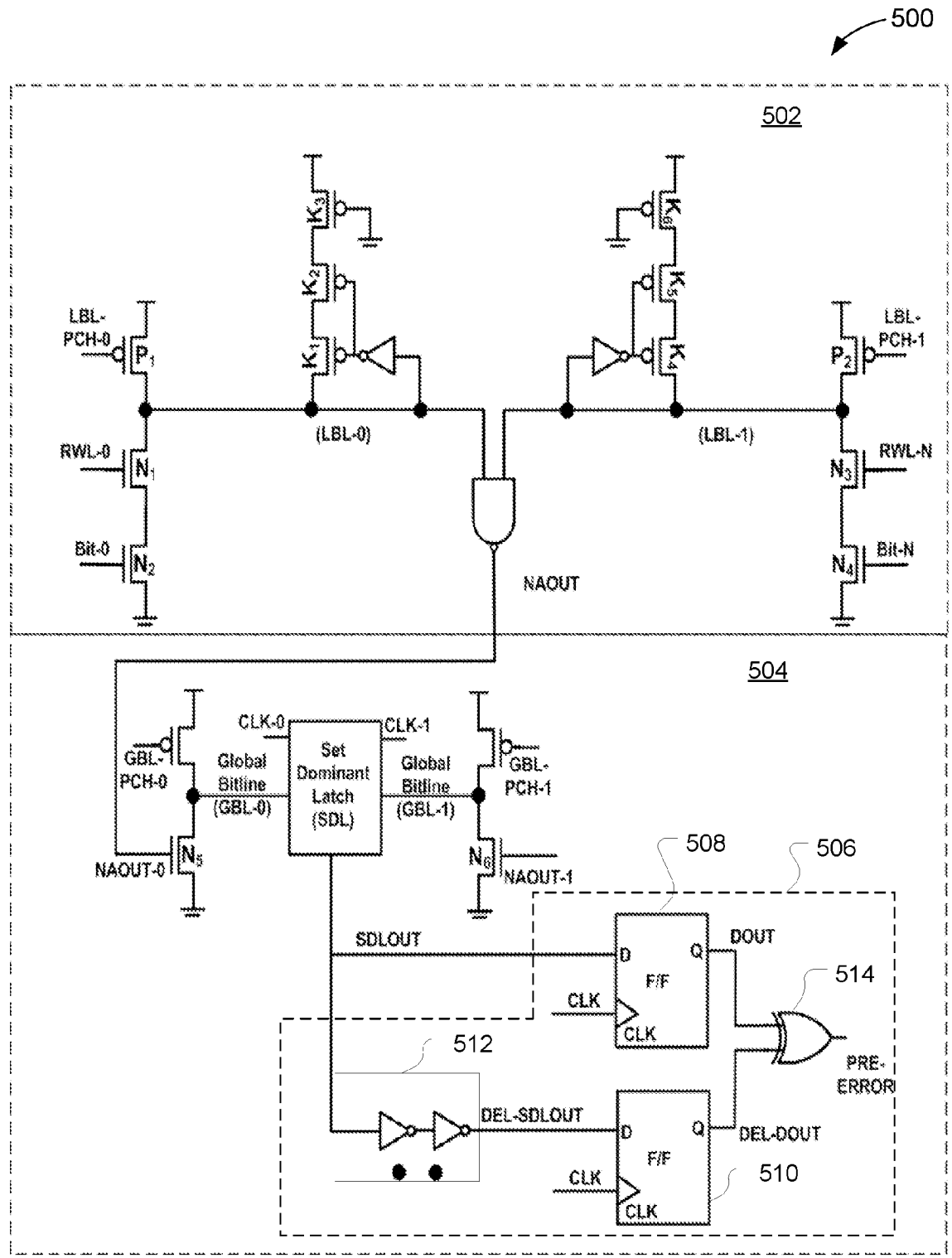
FIG. 3 illustrates a register file read path subsystem, according to another embodiment.

FIG. 3 illustrates a register file read path subsystem 500 that provides monitoring capability for sampling errors in the read path so as to enable the CPU to proactively compensate for sampling errors. The register file read path subsystem 500 includes a local bitline stage 502 and a global bitline stage 504. The local bitline stage 502 may operate similar the local bitline stage 300.

The global bitline stage 504 includes a performance monitoring sequence 506. The performance monitoring sequence 506 is configured to monitor two or more time-delayed phases of the output signal SDLOUT. The performance monitoring sequence 506 then provides one or more indications that correspond to how much more quickly the read path subsystem 500 may be operated.

The performance monitoring sequence 506 includes a first clock-responsive device 508, a second clock-responsive device 510, delay devices 512, and a signal differentiator 514. The first clock-responsive device 508 operates in a manner similar to that described above in connection with the first clock-responsive device 328. The second clock-responsive devices 510 and the delay devices 512 generate a time-delayed version of the output of the first clock-responsive device 508. By comparing the outputs of the first clock-responsive device 508 and the second clock-responsive device 510 with the signal differentiator 514, the performance monitoring sequence 506 generates an indication of how much faster the output signal SDLOUT may be sampled before generating a sampling error. According to one embodiment, the performance monitoring sequence 506 includes a plurality of second clock-responsive devices 510 that are communicatively coupled to a respective plurality of delay devices 512. Thus, the performance monitoring sequence 506 may characterize how much more quickly the output signal SDLOUT may be sampled.

Figure 4:
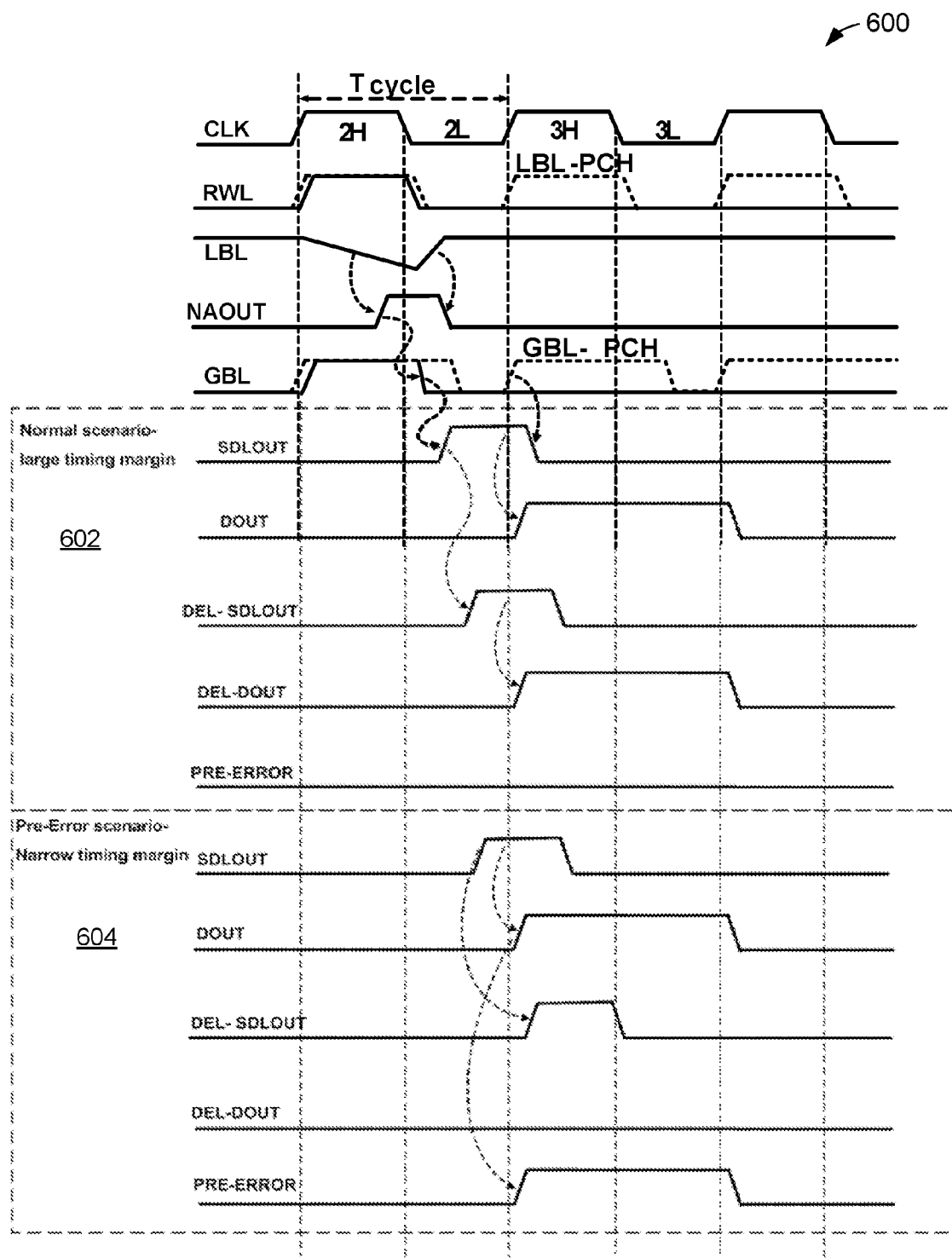
FIG. 4 illustrates a signal timing diagram of an example operation of the read path subsystem of FIG. 3, according to one embodiment.

FIG. 4 illustrates a signal timing diagram 600 in accordance with operation of an embodiment of the read path subsystem 500. The signal timing diagram 600 illustrates a "normal" scenario 602 having a large timing margin and a "pre-error" scenario 604 having a narrow timing margin.

The normal scenario 602 shows that an output signal DOUT of the first clock-responsive device 508 and an output signal DEL-DOUT of the second clock-responsive device 510 are the same. Because the output signal DOUT and the output signal DEL-DOUT are the same, the signal differentiator 514 does not generate a pre-error output PRE-ERROR. Accordingly, the core of the CPU may increase the operating frequency or decrease the supply voltage because a time margin, based on the duration of the delay devices 512, exists on the output signal SDLOUT.

The pre-error scenario 604 shows the response of the performance monitoring sequence 506 if the output signal DOUT of the first clock-responsive device 508 and the output signal DEL-DOUT of the second clock-responsive device 510 are different. Because the output signal SDLOUT did not have a time margin that is equal to or greater than the delay of delay device 512, the output signal DEL-DOUT fails to sample the output signal DEL-DOUT at time T3, and the signal differentiator 514 generates a pre-error output PRE-ERROR. Accordingly, the core of the CPU may maintain or decrease performance characteristics of the read path subsystem 500 based on the limited sampling margin of the output signal SDLOUT. According to one embodiment, the CPU increases performance characteristics in response to the normal scenario, and the CPU maintains performance characteristics in response to the pre-error scenario.

Figure 5:
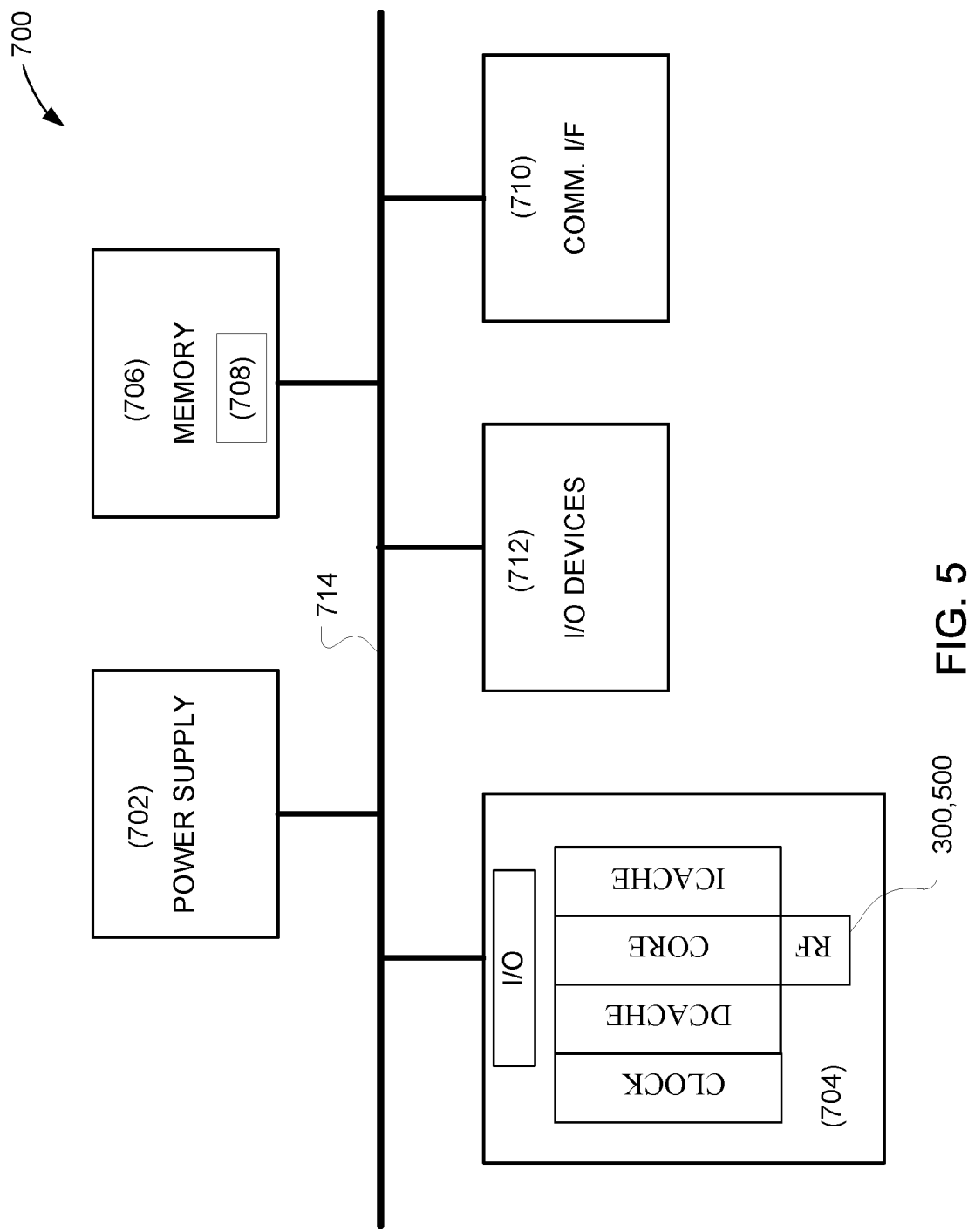
FIG. 5 illustrates a computer system incorporating the subsystem and related features of any one or combination of FIGS. 1, 2, 3, and 4, according to one embodiment.

Embodiments of the register file read paths 300 and 500 described herein may be used in a number of implementations and applications. For example, mobile devices, including but not limited to smart phones, nettops or laptops, tablets and other Mobile Internet Devices (MIDs) may use differential signaling in some embodiments. The register file read paths 300 and 500 may also be used read only memory (ROM), programmable one time memory (PROM), content addressable memory (CAM), and other memory devices having a single ended large signal sensing with a local and global bitline organization. FIG. 5 is a block diagram that illustrates an example computer system 700 suitable to practice the disclosed register file read paths 300 and 500 and related circuitry, and method of operation thereof according to various embodiments.

As shown, the computer system 700 may include a power supply unit 702, a number of processors or processor cores 704, a system memory 706 having processor-readable and processor-executable instructions 708 stored therein, and a communication interface 710. For the purpose of this application, including the claims, the terms "processor" and "processor cores" may be considered synonymous, unless the context clearly requires otherwise.

The processors 704 may include or be communicatively coupled to a register file (RF) read path subsystem 300, 500. The processors 704 may also include a clock, a data cache DCACHE, a core, an instruction cache ICACHE, and an input/output interface I/O. According to one embodiment, one or more of the data cache DCACHE and the instruction cache ICACHE may be implemented with the register file read path subsystem 300, the register file read path subsystem 500, or a combination of the register file read path subsystems 300 and 500.

The memory 706 may comprise a tangible, non-transitory computer-readable storage device (such as a diskette, hard drive, compact disc read only memory (CDROM), hardware storage unit, and so forth). The computer system 700 may also comprise input/output devices 712 (such as a keyboard, display screen, cursor control, and so forth).

The various elements of FIG. 5 may be coupled to each other via a system bus 714, which represents one or more buses. In the case of multiple buses, they may be bridged by one or more bus bridges (not shown). Data may pass through the system bus 714 through the processors 704.

The system memory 706 may be employed to store a working copy and a permanent copy of the programming instructions implementing one or more operating systems, firmware modules or drivers, applications, and so forth, herein collectively denoted as 708. The permanent copy of the programming instructions may be placed into permanent storage in the factory, or in the field, through, for example, a distribution medium (not shown), such as a compact disc (CD), or through the communication interface 710 (from a distribution server (not shown)).

According to various embodiments, one or more of the depicted components of the system 700 and/or other element(s) may include a keyboard, LCD screen, non-volatile memory port, multiple antennas, graphics processor, application processor, speakers, or other associated mobile device elements, including a camera.

The remaining constitution of the various elements of the computer system 700 is known, and accordingly will not be further described in detail.

The above description of illustrated embodiments, including what is described in the Abstract, is not intended to be exhaustive or to be limited to the precise forms disclosed. While specific embodiments and examples are described herein for illustrative purposes, various modifications are possible. For example, the configuration and connection of certain elements in various embodiments have been described above in the context of high/low values of signals, responses to rising/falling edges of signals, inverters to invert signals, P-type and N-type transistors, and so forth. In other embodiments, different configurations can be provided in view of whether N-type transistors are used instead of P-type transistors, whether or not certain signals are inverted, whether certain changes in state are triggered in response to falling edges instead of rising edges or vice versa, and so forth.

These and other modifications can be made in light of the above detailed description. The terms used in the following claims should not be construed to be limited to the specific embodiments disclosed in the specification.

What is claimed is:

1. An apparatus, comprising:
   at least one bitline; and
   a register file circuit including bitcells coupled to the at least one bitline, the register file circuit to operate with a decreased voltage guardband that compensates for a sampling error in a signal provided in the at least one bitline during an access operation, the register file circuit to operate with the decreased voltage guardband by detecting the sampling error if the sampling error occurs in response to the access operation and by repeating the access operation if the sampling error is detected;
   wherein the register file circuit includes:
   an edge-triggered clock-responsive device; and
   a level-triggered clock-responsive device, the register file circuit to detect the sampling error if an output of the edge-triggered clock-responsive device differs from an output of the level-triggered clock-responsive device.

2. The apparatus of claim 1 wherein the voltage guardband is decreased to be between 0 and 5 percent of a minimum operating voltage associated with the register file circuit.

3. The apparatus of claim 1 wherein the voltage guardband is decreased to be between 0 and 1 volt.

4. The apparatus of claim 1 wherein the voltage guardband is decreased to be 0 volts.

5. The apparatus of claim 1, wherein the register file circuit includes a post-error sampling error detection circuit to provide a notification of the sampling error after an erroneous sample of the signal.

6. The apparatus of claim 1, wherein the register file circuit includes a pre-error sampling error detection circuit to generate a notification of the sampling error before an erroneous sample of the signal.

7. The apparatus of claim 1, wherein the edge-triggered clock-responsive device and the level-triggered clock-responsive device are to receive an input signal that is representative of a voltage level on the at least one bitline.

8. A method, comprising:
   reducing, in a bitcell, a guardband voltage of a supply voltage that is used to reduce errors during bitcell evaluation in a register file circuit;
   while the guardband voltage is reduced, detecting a sampling error in an evaluation path of the bitcell based on a signal that is representative of a voltage level on a bitline coupled with the bitcell by determining that an output of an edge-triggered clock-responsive device differs from an output of a level-triggered clock-responsive device; and
   while the guardband voltage is reduced, correcting the sampling error detected in the evaluation path and repeating evaluation of the bitcell.

9. The method of claim 8, wherein the reducing the guardband voltage includes reducing the guardband voltage to 0 volts.

10. The method of claim 8, wherein the correcting the sampling error includes decreasing an operating frequency of the register file circuit.

11. The method of claim 8, wherein the reducing the guardband voltage includes reducing the guardband voltage to between 0% and 8% of the supply voltage.

12. The method of claim 8, wherein the detecting the sampling error includes delaying a recharge of a voltage in the bitcell.

13. An apparatus comprising:
   means for reducing, in a bitcell, a guardband voltage of a supply voltage that is used to reduce errors during bitcell evaluation in a register file circuit;
   means for detecting, while the guardband voltage is reduced, a sampling error in an evaluation path of the bitcell based on whether an output of an edge-triggered clock-responsive device differs from an output of a level-triggered clock-responsive device; and
   means for correcting, while the guardband voltage is reduced, the sampling error detected in the evaluation path and repeating evaluation of the bitcell.

14. The apparatus of claim 13, wherein the means for reducing the guardband voltage includes means for reducing the guardband voltage to 0 volts.

15. The apparatus of claim 13, wherein the means for correcting the sampling error includes means for decreasing an operating frequency of the register file circuit.

16. The apparatus of claim 13, wherein the means for reducing the guardband voltage includes means for reducing the guardband voltage to between 0% and 8% of the supply voltage.

17. The apparatus of claim 13, wherein the means for detecting the sampling error includes means for delaying a recharge of a voltage in the bitcell.

\* \* \* \* \*